United States Patent
Stetson et al.

(10) Patent No.: US 6,552,614 B1
(45) Date of Patent: Apr. 22, 2003

(54) BROADBAND CABLE MODEM AMPLIFIER WITH PROGRAMMABLE BIAS CURRENT

(75) Inventors: Phillip Sean Stetson, Garland, TX (US); Neil Gibson, Richardson, TX (US); Marco Corsi, Parker, TX (US); Jim Quarfoot, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 09/708,691

(22) Filed: Nov. 8, 2000

(51) Int. Cl.[7] ................................. H03G 3/10
(52) U.S. Cl. ..................... 330/285; 330/129; 330/279
(58) Field of Search ............................ 330/285, 129, 330/279; 323/313, 314; 327/539

(56) References Cited

U.S. PATENT DOCUMENTS

| | | | | |
|---|---|---|---|---|
| 4,320,350 A | * | 3/1982 | Drapac | 330/202 |
| 5,414,389 A | * | 5/1995 | Watanabe et al. | 330/279 |
| 5,459,427 A | * | 10/1995 | Chambers et al. | 327/333 |
| 5,663,674 A | * | 9/1997 | Beyer et al. | 327/540 |
| 5,714,908 A | * | 2/1998 | Takahashi | 330/137 |
| 5,841,387 A | | 11/1998 | VanBuskirk | 341/155 |
| 5,864,748 A | | 1/1999 | Dail | 455/5.1 |
| 5,878,325 A | | 3/1999 | Dail | 455/5.1 |
| 5,936,391 A | * | 8/1999 | Larsen et al. | 323/313 |
| 5,963,844 A | | 10/1999 | Dail | 455/5.1 |
| 6,097,251 A | * | 8/2000 | Khullar et al. | 330/129 |
| 6,307,429 B1 | * | 10/2001 | Olgaard | 330/2 |

OTHER PUBLICATIONS

"AT&T Eyes Fiber–Rich Architecture" Cable Datacom News (cabledatacomnews.com)—Jul. 1999.

* cited by examiner

Primary Examiner—Henry Choe
(74) Attorney, Agent, or Firm—Dena L. Burton; W. James Brady; Frederick J. Telecky, Jr.

(57) ABSTRACT

An upstream programmable gain amplifier (PGA) (114, 214) for a cable modem (100) having a programmable bias current. PGA (114, 214) includes a bias current-setting circuit (140, 240) coupled to a power amplifier stage (136, 236), the bias current-setting circuit (140, 240) adapted to program the bias current $I_{bias}$ of the power amplifier stage (136, 236). The bias current-setting circuit (140) includes a bandgap generator (130, 230) having an external bias resistor $R_1$ at the input. The bias current-setting circuit (140) may include a variable gain amplifier (VGA) (134), a digital-to-analog converter (DAC) (132), and a bias code generator (138). The bias current-setting circuit (240) may alternatively include a plurality of programmable resistors $R_{1a}$, $R_{1b}$ ... $R_{1x}$ coupled to a bias code generator (238).

19 Claims, 2 Drawing Sheets

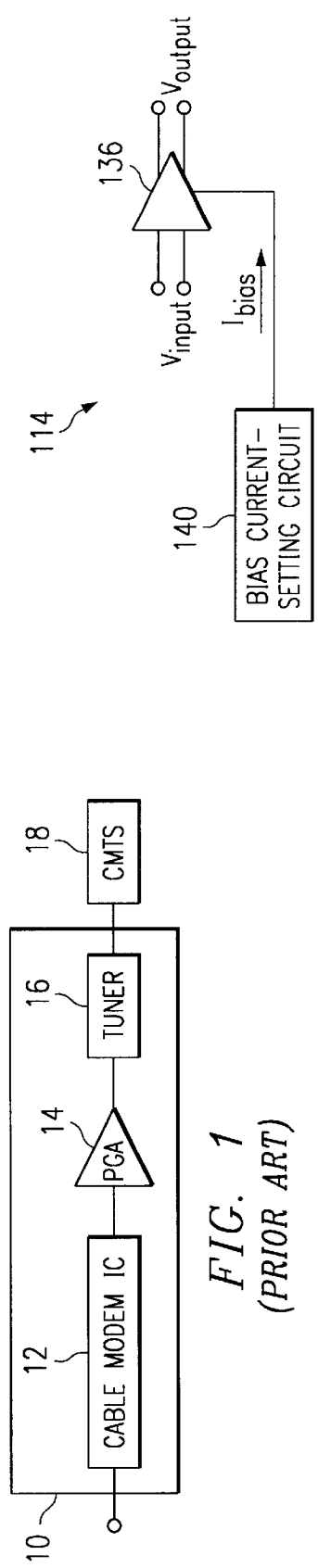
FIG. 1
(PRIOR ART)
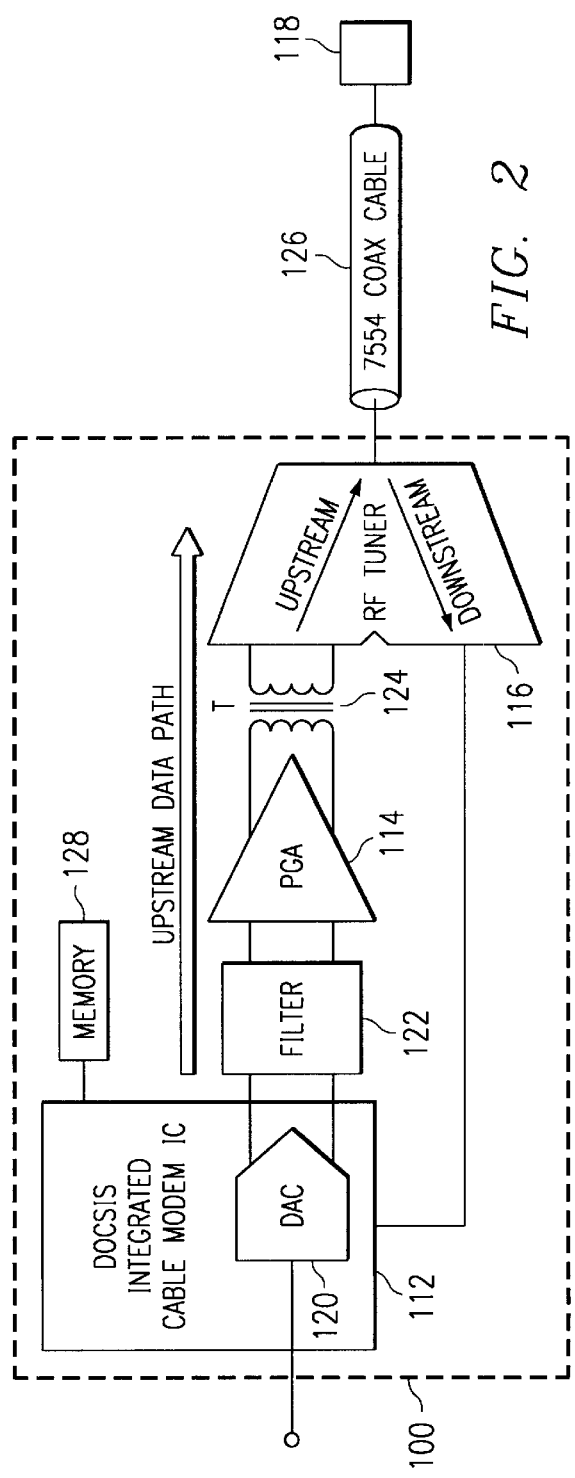
FIG. 2
FIG. 3

BROADBAND CABLE MODEM AMPLIFIER WITH PROGRAMMABLE BIAS CURRENT

TECHNICAL FIELD

This invention relates generally to cable modems, and more particularly to an upstream programmable gain amplifier.

BACKGROUND OF THE INVENTION

Cable modems are being deployed today that allow high-speed Internet access in the home over a cable network, often referred to as a hybrid fiber copper (HFC) cable network. The architecture of a typical cable modem used in a cable network is shown in FIG. 1. A cable modem 10 is a unit, often referred to as consumer premise equipment (CPE), that is connected to a personal computer (PC) or other computing device, for example. The cable modem 10 is adapted to communicate with the cable modem termination system (CMTS) 18 that is typically located at a cable network provider's headend. The cable modem 10 is a modulator/demodulator that receives Internet traffic or other information from a server through the CMTS 18 and puts it into a format recognizable by a user's PC, allowing a user to browse the Internet and send/receive e-mail just as they would with a conventional modem on a PC. Using a cable modem 10 over a cable network provides a much faster connection, being at least 50 times faster than a 56K modem, for example.

Cable modem 10 includes a cable modem integrated circuit (IC) 12 which may comprise a single IC or a plurality of IC's. The cable modem IC 12 performs the modulation and demodulation for the cable modem 10 and the operations necessary to interface with the PC. Cable modem 10 also includes support circuitry such as memory elements and other components, not shown. Cable modem 10 includes a tuner 16 coupled to cable modem IC 12 through a power amplifier that is referred to as a programmable gain amplifier (PGA). Tuner 16 interfaces the cable modem 10 with the CMTS 18 of the cable network and handles the upstream and downstream signal paths or data streams. PGA 14 drives the upstream direction signal through the tuner 16. The PGA 14 interfaces the cable modem IC 12 to the cable network CMTS 18. The PGA 14 drives the upstream data signals on the cable that is plugged into the cable outlet in a home, and the cable is coupled to the headend or CMTS 16. PGA 14 may be packaged as part of the tuner 16, or alternatively, the PGA 14 may be packaged separately from the tuner 16 within the cable modem 10, as shown. The programmable gain amplifier (PGA) 14 provides the power amplification of the upstream channel.

In the United States and other countries, the cable industry is guided by the Data Over Cable System Interface Specification (DOCSIS) standard. According to DOCSIS, the CMTS 18 expects to receive a signal having a particular signal power level from every cable modem 10. Because the distance between the cable modem 10 user and the CMTS 18 module varies from home to home, cable modem 10 is required to transmit differing power levels in order to ensure that the same cable modem upstream signal power level is received at the CMTS 18 for all cable modems 10 serviced by the CMTS 18. The PGA 14 is responsible for providing the variable programmable gain for the upstream signals from the cable modem 10 to the CMTS 18 to achieve differing power levels for different homes depending on how far away they are from the CMTS 18.

The DOCSIS standard places requirements on the characteristics of the cable modem 10 signal output which the PGA 14 is responsible for amplifying. These DOCSIS requirements include certain system performance levels, such as in-band and out-of-band frequency harmonics. The CMTS 18 tells the cable modem 10 what frequency to transmit on, which is basically what channel to use, in the upstream direction. The cable network frequency range may be, for example, from 5 megahertz to 65 megahertz in the European standard, and 5 megahertz to 42 megahertz in the North American standard.

Certain elements of the cable modem 10 such as the digital-to-analog converter (DAC) (not shown) of the cable modem IC 12 or the power amplifier may generate harmonics, which are multiples of the channel frequency. These harmonics may interfere with other user's cable modems, or the other signals coming from other users' cable modems that may be assigned different channels. Sometimes the upstream harmonics can fold into in the downstream signal, causing interference. DOCSIS places certain levels on those harmonics to ensure that they are at a sufficiently low power level. The distortion performance of the PGA 14 is important in that regard.

A variety of different architectures have been used for prior art cable modem PGA's 14, which typically comprise Class A and other power amplifiers and have a variable programmable gain. A problem with prior art PGA's 14 is that their power dissipation is invariant with the gain settings, resulting in an inefficient use of power in the cable modem 10.

SUMMARY OF THE INVENTION

The present invention optimizes system power of a cable modem by providing a PGA having a programmable bias current. The direct relationship of distortion performance to bias current within a Class A amplifier is used advantageously to provide programming capability of the PGA bias current. The programmable bias current PGA includes a bias current-setting circuit coupled to the bias input of a power amplifier stage.

Disclosed is an upstream programmable gain amplifier (PGA) for a cable modem, comprising a power amplifier stage and a bias current-setting circuit coupled to the power amplifier stage bias input, where the bias current-setting circuit is adapted to program the bias current of the power amplifier stage.

Also disclosed is a bias current-setting circuit for an upstream programmable gain amplifier (PGA) of a cable modem, the circuit including a bandgap generator coupled to an input of the variable gain amplifier and an external resistor coupled to an input of the bandgap generator.

Further disclosed is a cable modem for transmitting data signals between a cable modem termination system (CMTS) over a cable network, the cable modem comprising a cable modem integrated circuit (IC) adapted to receive upstream data signals from a personal computing device and a programmable gain amplifier (PGA) coupled to the cable modem IC output having a programmable bias current and adapted to amplify the upstream data signals. A tuner is coupled to the PGA output for modulating and demodulating the amplified upstream data signals in preparation for transmission to the CMTS.

Also disclosed is a method of programming the bias current of a programmable gain amplifier for a cable modem, comprising establishing a nominal bias current, receiving a bias code, using the bias code to vary the nominal bias current to produce a bias current for a programmable gain amplifier, and applying the bias current to the programmable gain amplifier bias input.

Advantages of the invention include increasing the efficiency of a cable modem and PGA by optimizing the power for a given required level of performance. Power versus the required performance and the bias current versus a bias code may be varied. The power savings is particularly beneficial for voice-over IP and high-speed data service applications for cable modem systems. Gain may be varied in 6 dB steps, which is coarser than required by DOCSIS. The invention is inexpensive to implement, requiring few circuit components and a small amount of memory.

BRIEF DESCRIPTION OF THE DRAWINGS

The above features of the present invention will be more clearly understood from consideration of the following descriptions in connection with accompanying drawings in which:

FIG. 1 illustrates the architecture of a prior art cable modem coupled to a CMTS in a cable network;

FIG. 2 shows the architecture of the present programmable bias current PGA implemented in a cable modem;

FIG. 3 illustrates a block-level design of the programmable bias current PGA of the present invention;

Corresponding numerals and symbols in the different figures refer to corresponding parts.

DETAILED DESCRIPTION OF PREFERRED EMBODIMENTS

Figure 4:
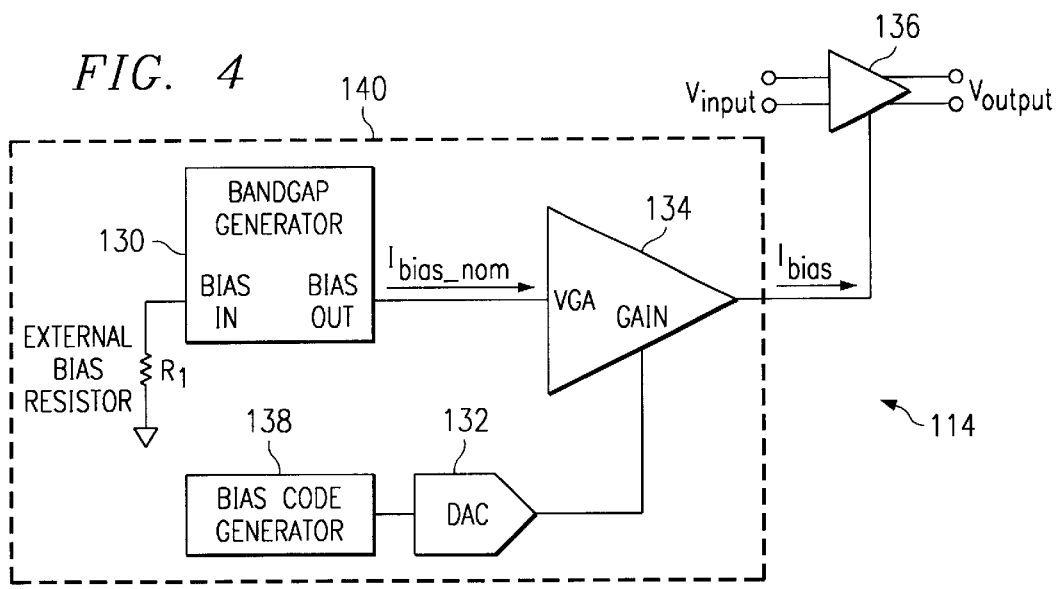
FIG. 4 shows an embodiment of the present invention having a bandgap generator coupled to the input of a variable gain amplifier (VGA) and a DAC coupled to the VGA adapted to vary the bias current.

FIG. 2 illustrates the architecture of a cable modem 100 including PGA 114 of the present invention. Cable modem IC 112 includes a digital-to-analog converter (DAC) 120 that generates an upstream data signal at the output in response to an input from the user utilizing other circuitry within cable modem IC 112, not shown. The outputs of DAC 120 are coupled to the inputs of filter 122 which preferably comprises a low pass filter and may comprise an antialiasing filter, for example. Filter 122 is adapted to remove some of the harmonics and images on the upstream data signal that may be generated by DAC 120. Cable modem IC 112 is also coupled to memory 128 having programmed response information for the cable modem IC 112 bias current. As examples, memory 128 may be a ROM, dynamic memory (DRAM), SRAM, or non-volatile memory such as EPROM, EEPROM or flash EEPROM.

The inputs of programmable gain amplifier (PGA) 114 are coupled to the outputs of the low-pass filter 122. PGA 114, described further herein with reference to FIGS. 3–6, provides the power amplification required by the CMTS 118. The output of PGA 114 is coupled to the inputs of transformer 124. Transformer 124 preferably comprises a centertapped primary transformer, for example, a transformer with the primary side having three inputs, one on either side and one in the center of the coil. Transformer 124 is adapted to transform the upstream data signal at the outputs of PGA 114 to a signal having increased power and suitable for transmission through the cable network.

The outputs of transformer 124 are coupled to the inputs of tuner 116 which preferably comprises an RF tuner having a duplexer or splitter. The output of RF tuner 116 is coupled to a cable network 126 which may include a 75 ohm cable and other cable network elements. Cable network 126 may be a HFC. RF tuner 116 combines the upstream and downstream direction data signals into a single feed at the cable network. RF tuner 116 duplexer is adapted to direct downstream data signals to the cable modem IC 112 and direct upstream data signals to CMTS 118 via cable network 126. RF tuner 116 may include a low pass filter (not shown) that provides more attenuation of the harmonics on the data signal. RF tuner 116 provides frequency selection and is adapted to allow the upstream channel to transmit through to CMTS 118, while not allowing the downstream channel to come back through the upstream channel.

FIG. 3 illustrates a block diagram of the architecture, a programmable bias current PGA 114 of the present invention. Power amplifier stage 136 is adapted to receive an input voltage $V_{input}$ at the inputs and produce an output voltage $V_{output}$ at the outputs, and includes a bias input. Power amplifier stage 136 preferably comprises a class A amplifier and alternately comprise other types of variable gain amplifiers. Power amplifier stage 136 provides the power amplification for PGA 114. A bias current-setting circuit 140 is coupled to the biasing input of the power amplifier stage 136. Bias current $I_{bias}$ comprises the upstream amplifier bias current and flows from the bias current-setting circuit 140 output to the biasing input of the power amplifier stage 136. Bias current-setting circuit 140 is adapted to program or set the bias current $I_{bias}$ of the power amplifier stage 136.

FIG. 4 shows an embodiment of the present invention, with the bias current-setting circuit 140 comprising a bandgap generator 130 having an input and an output. The output of bandgap generator 130 is coupled to the input of a variable gain amplifier (VGA) 134. Bandgap generator 130 output provides a current reference to VGA 134 input. VGA 134 preferably comprises a circuit through which the current reference created by the bandgap generator 130 is scaled up or down and relayed to the power amplifier stage 136. The output of VGA 134 is coupled to the biasing input of the power amplifier stage 136. Bias current $I_{bias}$ comprises the upstream amplifier bias current and flows from the VGA 134 output to the biasing input of the power amplifier stage 136. A bias code generator 138 comprising an externally programmed memory having a bias code is coupled to the input of a digital-to-analog converter (DAC) 132. DAC 132 output is coupled to the bias input of the VGA 134.

Bandgap generator 130 supplies and sets the nominal bias current $I_{bias\_nom}$ to the VGA 134. An external bias resistor $R_1$ is coupled at one end to the bandgap generator 130 input and at the other end to ground. The bias current $I_{bias}$ of the power amplifier is set by the combination of the following elements: resistor $R_1$, bandgap generator 130, DAC 132 and VGA 134. The combination of resistor $R_1$ and bandgap generator 130 generate a nominal bias current $I_{bias\_nom}$. The programmed bias code is set by the system designer in the bias code generator 138 coupled to the DAC 132 input and varies depending on the desired operating point for the cable modem 100. The bias code generator 138 may comprise stored values of bias codes in memory 128 (FIG. 2), for example. The bias code generator 138 generates a voltage through DAC 132 that controls the amount of gain applied to the nominal bias current $I_{bias\_nom}$ to generate the bias current $I_{bias}$ for the power amplifier stage 136. The bias code generator 138 comprises a register internal to modem 100 loaded through a digital serial data interface. Through the various range of bias codes, the nominal bias current $I_{bias\_nom}$ may be varied by +/– about 25%, for example. Therefore, the bias current $I_{bias}$ varies around $I_{bias\_nom}$ by +/–25%. The percentage may vary, for example, it may be 30% to 50%, or 200%, although typically a value of +–50% or less is preferable.

In response to the bias code, DAC 132 translates the bias code into a voltage at the DAC 132 output. The DAC 132 output voltage varies the VGA 134 current gain to produce a programmed upstream bias current $I_{bias}$ current at VGA 134 output that is a fraction (more specifically, a percentage) above or below current $I_{bias\_nom}$. The class A amplifier comprising power amplifier stage 136 requires a bias current $I_{bias}$ to set performance characteristics of the amplifier stage 136. By providing a variable $I_{bias}$ current, performance characteristics of the power amplifier stage are programmable through the bias code.

Referring again to FIG. 2 along with FIG. 4, PGA 114 power amplifier stage 136 inputs are coupled to the output of the DAC 120 on cable modem IC 112. DAC 120 generates the upstream data signal and after passing through low-pass filter 122, the upstream signal is applied to the inputs of power amplifier stage 136 shown in FIGS. 3 and 4. Power amplifier stage 136 produces an amplified version of the upstream signal at the outputs.

Note that one purpose of a PGA 14 in a cable modem in general is to provide programmable gain. The programmable gain of the power amplifier stage 136 is distinguishable from the novel programmable bias current that is provided by the present invention. In accordance with the present invention, a bias code controls how the bias current $I_{bias}$ relates to the nominal bias current $I_{bias\_nom}$ on the digital side. Preferably, the bias code generated by the bias code generator 138 comprises four bits, which allows 16 states between the –25 and the +25%, or some other % from +/–15% to 200%, for example (see Table 1, below). Bias code generator 138 provides a voltage at the output, the bias code generator 138 output voltage causing the DAC 132 to produce a gain at its output that produces the % of $I_{bias_{13}\ nom}$ effect on the bias current $I_{bias}$ as reflected in Table 1.

TABLE 1

| Bias Code $I_{bias}$ | % of $I_{bias\_nom}$ |
| --- | --- |
| 0000 | –25 |
| 0001 | –21.875 |
| 0010 | –18.75 |
| 0011 | –15.625 |
| 0100 | –12.5 |
| 0101 | –9.375 |
| 0110 | –6.25 |
| 0111 | –3.125 |
| 1000 | 0 |
| 1001 | +3.125 |
| 1010 | +6.25 |
| 1011 | +9.375 |
| 1100 | +12.5 |
| 1101 | +15.625 |
| 1110 | +18.75 |
| 1111 | +21.875 |

The number of bits of the bias code is arbitrary, and may comprise other values. If the number of bit that represent the bias code is increased from 4 to 6, the number of bias code steps is increasing the programming resolution. If the bias code comprises 6 bit, the bias code then has 64 steps (i.e. $2^6$), for example. Referring again to FIG. 2, the bias is generated or stored within the programmed data for the cable modem chip in memory 128 comprising a ROM, for example. In this example, the system designer of the cable modem 100 through a serial data interface.

In use, the cable modem 100 responds to instructions from the CMTS 118. The CMTS 118 communicates to the cable modem 100 the operating point for the cable modem 100, with the operating point including the channel frequency and channel power, for example. Each command from the CMTS 118 requires a response from the cable modem 100. The cable modem 100 responses are designed by the system designer of the cable modem 100, and the programming for the cable modem 100 responses are stored within the cable modem 100 in memory 128 which may comprise, for example, a read-only memory such as a flash EEROM or electrically-erasable programmable ROM. Memory 128 may be a part of cable modem IC 112, but may also be a part of other components within cable modem 100. The cable modem 100 responses are operating points that the cable modem 100 will place itself in, in response to different commands from CMTS 118. The responses include settings for the PGA 114 including gain and in accordance with the present invention, the bias current for the power amplifier stage 136.

Figure 5:
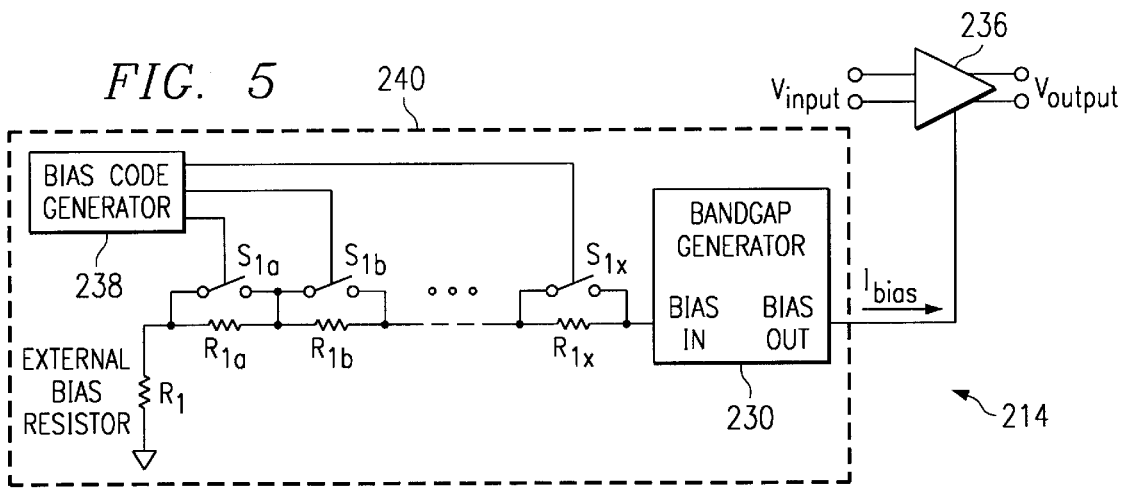
FIG. 5 shows an embodiment of the present invention where a bias code generator is coupled to switches for controlling the amount of resistance at the input of a bandgap generator, which varies the bias current of the power amplifier stage.

A second embodiment of the present invention is shown generally at 214 in FIG. 5 with an alternative implementation of bias current-setting circuit 240. A plurality of programmable resistors $R_{1a}, R_{1b} \ldots R_{1x}$ are coupled between external resistor $R_1$ and the bandgap generator 230. Resistors $R_{1a}, R_{1b} \ldots R_{1x}$ preferably have a resistance value smaller than the value of $R_1$. Each resistor $R_{1a}, R_{1b} \ldots R_{1x}$ is coupled in parallel to a respective switch $S_{1a}, S_{1b} \ldots S_{1x}$. The resistors $R_{1a}, R_{1b} \ldots R_{1x}$ are sized so that when switches $S_{1a}, S_{1b} \ldots S_{1x}$ are opened or closed they add a predetermined amount of resistance to resistor $R_1$. The output of bias code generator 238 is controllably coupled to switches $S_{1a}, S_{1b} \ldots S_{1x}$. The bias code programmable through a serial interface is programmed into the PGA 214. The bias code generated opens or closes the switches to set the amount of added resistance to resistor $R_1$. Programmable resistors $R_{1a}, R_{1b} \ldots R_{1x}$ provide an ability to program or vary the value of the nominal bias current $I_{bias\_nom}$ (not shown, but preferably located at a mid-point between the serial programmable resistors), which varies the bias current $I_{bias}$ input to power amplifier stage 236.

Preferably the programmable resistors $R_{1a}, R_{1b} \ldots R_{1x}$ are implemented in series with external bias resistor R1 as shown, although alternatively, they may be coupled in parallel. However, in a parallel configuration, the value of the resistance would be decreasable rather than increasable as with the series circuit, and this would require larger resistors on the integrated circuit, which requires more silicon area. With the series implementation, the nominal bias current $I_{bias\_nom}$ may be set such that half of the smaller resistors are open and half are closed, so the total resistance can be varied up by increasing the open resistors or vice versa. In one embodiment, each of the resistors $R_{1a}, R_{1b} \ldots R_{1x}$ has a resistance that is one-half of another of the resistors. In this manner, a wide range of resistance may be implemented by controlling switches $S_{1a}, S_{1b} \ldots S_{1x}$ individually.

The overall value of the external resistance provided by resistor $R_1$, programmable resistors $R_{1a}, R_{1b} \ldots R_{1x}$ in combination with the band gap generator 230 sets the level of the bias current $I_{bias}$. By varying the resistance through the use of on-chip programmable resistors, the bias current $I_{bias}$ may be varied directly rather than using DAC 132 and VGA 134 to have the same effect as in the first embodiment. Therefore, DAC 132 and VGA 134 shown in FIG. 4 may be eliminated by the use of the programmable resistors $R_{1a}$, $R_{1b}$ ... $R_{1x}$.

Figure 6:
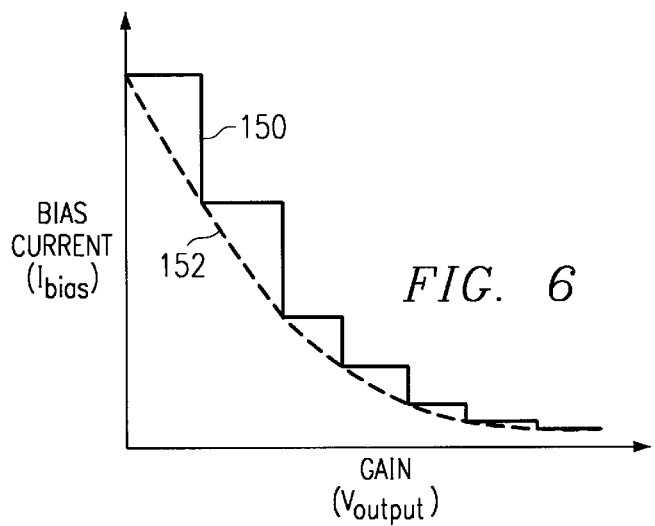
FIG. 6 is a graph illustrating the bias current to gain relationship of the present PGA.

FIG. 6 illustrates in graphical form the gain to bias current relationship of the programmable bias current PGA 136. Higher gains require higher bias currents and the stair-step function 150 represents what the nominal bias current level is at each gain setting. The function 150 is stair-stepped because there are distinct gain settings within the disclosed invention. The use of the bias code smoothes out the curve, shown at 152, by interpolating, or smoothing out the steps between the bias current and gain.

The novel circuit and method disclosed herein achieves technical advantages by providing a programmable bias current PGA 114, 214. Efficiency is increased by controlling the power level dictated by the bias current $I_{bias}$ of the PGA 114, 214 to that which is required for the particular operating point rather than the worst case operating point. With the present programmable bias current PGA 114, 214, a designer is able to optimize the power for a given required level of performance in the PGA 214, 214, reducing the power requirement at any point.

The programmable bias current PGA 114, 214 described herein is advantageous over prior art PGAs that do not have the capability to vary power dissipation versus required performance, or vary the bias current versus a bias code, as in the present invention. Prior art PGA's do not optimize the power level of the amplifier for differing requirements of performance, which results in an inefficient amplifiers that consume more power than is necessary for all operating points. Prior art PGA's are required to work in worse case conditions all the time to handle the worse case harmonic distortion requirements. In contrast, the present programmable bias current PGA allows another degree of freedom and provides more flexibility in the system design by giving the system designer a means of adjusting the performance and power of the amplifier to meet the required performance of any operating point rather than the worse case operating point.

The present invention takes advantage of the fact that a Class A amplifier has a distortion performance that is related directly to the bias current within the Class A amplifier. The present invention utilizes the distortion performance/bias current relationship to provide a means for programming the PGA 114, 214 bias current such that distortion performance may be tuned around a nominal value. For a particular cable modem manufacturer's system, based on the channel frequency that the CMTS 118 sets, the characteristics of the low-pass filter and the filter within the tuner, and what distortion performance is required from the power amplifier given its gain setting, are known. Based on these known factors for a particular CMTS 118, in accordance with the programmable bias current PGA 114, 214 described herein, a system operator is able to only use as much power as necessary to obtain the required distortion performance, which improves the efficiency of the PGA 114, 214. This is particularly important for voice-over IP and high-speed data service applications for cable modem systems.

Another advantage of the invention is that it allows the amplifier to vary gain in steps such as 6 dB steps which is more coarse than required by DOCSIS. The more coarse range is achievable because the cable modem IC 112 has fine gain control, yet has limited range. The range is provided by programmable bias current PGA 114, 214. The gain setting and the bias current gain setting is set by the maximum gain of that range, and is set by the worse case signal for that particular gain setting. Because the cable modem IC 112 provides the fine gain control between the two settings, the two settings are at different operating points and they each require less current. Therefore, the programmable bias current allows the system designer to bring down the level of the bias current for those gain steps in between the 6 dB steps in order to optimize power for the particular operating point rather than for the worse case operating point.

The present PGA 114, 214 having an optimized power performance is particularly useful for a cable modem system utilized for voice-over IP applications. If the cable network is used to provide telephone services to the home, those services should be intact and working even when there is a power outage to the home. The continuous operation requirement means that the cable modem 100 should have a battery backup or that the cable modem 100 must be powered by the cable itself. In either case, the amount of power that the cable modem 100 consumes directly impacts the cost of deployment and the amount of backup time available on lifeline telephone services. The present programmable bias current PGA 114, 214 reduces the cost of deployment and provides longer backup protection upon a power outage for voice-over IP applications.

Also, the present invention is inexpensive to implement, requiring few circuit components and a small amount of memory.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. For example, although the invention is described herein implemented in software, the invention may also be implemented in hardware. A digital solution has been described, although an analog approach may also be used. Varying the gain in 6 dB steps with the present invention has been described herein, although other incremental steps are possible, e.g., 1 dB steps. It is therefore intended that the appended claims encompass any such modifications or embodiments.

What is claimed is:

1. A programmable gain amplifier (PGA), comprising:
   a power amplifier stage having an input, an output and a bias input; and
   a bias current-setting circuit having an output coupled to the power amplifier stage bias input, wherein the bias current-setting circuit is adapted to program a bias current of the power amplifier stage;
   the bias current-setting circuit comprising:
      a bandgap generator having an input and an output, the bandgap generator output coupled to the power amplifier stage bias input;
      an external bias resistor coupled to the input of the bandgap generator;
      a variable gain amplifier (VGA) having an input and an output, the VGA output coupled to the power amplifier stage bias input, the VGA input coupled to the bandgap generator output, the VGA adapted to provide bias current for the power amplifier stage, the bandgap generator producing a nominal bias current at the output;
      a digital-to-analog converter (DAC) having an input and an output adapted to receive a digital signal at the input and produce an analog signal at the output, the DAC output coupled to a bias input of the VGA; and a bias code generator coupled to the DAC input adapted to program the bias current of the power amplifier stage.

2. The PGA according to claim 1 wherein the power amplifier stage comprises a Class A amplifier.

3. The PGA according to claim 1 wherein the bias code generator comprises information stored in memory.

4. The PGA according to claim 3 wherein the bias code generator comprises a binary code table, wherein the range of binary codes are adapted to adjust the VGA gain by about +/−25% of the power amplifier stage bias current.

5. The PGA according to claim 1 wherein the bias current-setting circuit further comprises:

a plurality of resistors coupled together in series between the external bias resistor and the bandgap generator;

a plurality of switches, each switch coupled in parallel with an associated resistor; and the bias code generator having a plurality of outputs comprising a bias code, each switch being coupled to and controlled by an output of the bias code generator, wherein altering the bias code applied to the switches alters the bias current.

6. A bias current-setting circuit for a programmable gain amplifier (PGA), the bias-current setting circuit comprising:

a bandgap generator coupleable to a bias input of the PGA;

an external resistor coupled to an input of the bandgap generator;

a variable gain amplifier (VGA) having an input and an output, the VGA output coupled to a power amplifier stage bias input, the VGA input coupled to a bandgap generator output, the VGA adapted to provide bias current for the power amplifier stage, the bias current-setting circuit adapted to generate a nominal bias current;

a digital-to-analog converter (DAC) having an input and an output adapted to receive a digital signal at the input and produce an analog signal at the output, the DAC output coupled to a bias input of the VGA; and a bias code generator coupled to the DAC input adapted to program the bias current of the power amplifier stage.

7. The bias current-setting circuit according to claim 6 wherein the bias code generator comprises information stored in memory.

8. The bias current-setting circuit according to claim 7 wherein the bias code generator comprises a binary code table, wherein the range of binary codes are adapted to adjust the VGA gain by about +/−25% of the power amplifier stage bias current.

9. The bias current-setting circuit according to claim 6 further comprising:

a plurality of resistors coupled together in series between the external bias resistor and the bandgap generator;

a plurality of switches, each switch coupled in parallel with an associated resistor; and the bias code generator having a plurality of outputs comprising a bias code, each switch being coupled to and controlled by an output of the bias code generator, wherein altering the bias code applied to the switches alters the bias current.

10. A cable modem for transmitting data signals between a cable modem termination system (CMTS) over a cable network, the cable modem comprising:

a cable modem integrated circuit (IC) adapted to receive upstream data signals from a personal computing device, the cable modem IC having an output;

a programmable gain amplifier (PGA) having an input and an output, the PGA input coupled to the cable modem IC output, the PGA having a programmable bias current and being adapted to amplify the upstream data signals;

the PGA comprising:

a power amplifier stage having an input, an output, and a bias input; and a bias current-setting circuit having coupled to the power amplifier stage bias input, wherein the power amplifier stage bias current is adapted to be programmed by the bias current-setting circuit;

the PGA bias current-setting circuit comprising:

a bandgap generator having an input and an output, the bandgap generator output coupled to the power amplifier stage bias input;

an external bias resistor coupled to the input of the bandgap generator;

a variable gain amplifier (VGA) having an input and an output, the VGA output coupled to the power amplifier stage input, the VGA input coupled to the bandgap generator, the VGA adapted to supply bias current for the power amplifier stage;

a digital-to-analog converter (DAC) having an input and an output adapted to receive a digital signal at the input and produce an analog signal at the output, the DAC output coupled to a bias Input of the VGA; and a bias code generator coupled to the DAC input; and a tuner coupled to the PGA output adapted to modulate and demodulate the amplified upstream data signals in preparation for transmission to the CMTS.

11. The cable modem according to claim 10 wherein the PGA power amplifier stage comprises a Class A amplifier.

12. The cable modem according to claim 10 wherein the bias code generator of the bias current-setting circuit comprises information stored in memory.

13. The cable modem according to claim 12 wherein the PGA bias code generator comprises a binary code table, wherein the range of binary codes are adapted to adjust the VGA gain by about +/−25% of the power amplifier stage bias current.

14. The cable modem according to claim 10 wherein the PGA bias current-setting circuit further comprises:

a plurality of resistors coupled together in series between the external bias resistor and the bandgap generator;

a plurality of switches, each switch coupled in parallel with an associated resistor; and the bias code generator having a plurality of outputs comprising a bias code, each switch being coupled to and controlled by an output of the bias code generator, wherein altering the bias code applied to the switches alters the bias current-setting circuit nominal bias current.

15. A tuner adapted to modulate and demodulate data signals in preparation for transmission to a cable modem termination system (CMTS), the tuner comprising a programmable gain amplifier (PGA) for amplifying data signals before submission to the CMTS, the PGA comprising:

a power amplifier stage having an input, an output, and a bias input; and a bias current-setting circuit, coupled to the power amplifier stage bias input, wherein the bias current-setting circuit is adapted to program a power amplifier stage bias current;

the bias current-setting circuit comprising:
- a bandgap generator having an input and an output, the bandgap generator output coupled to the power amplifier stage bias input;
- an external bias resistor coupled to the input of the bandgap generator;
- a variable gain amplifier (VGA) having an input and an output, the VGA output coupled to the power amplifier stage input, the VGA input coupled to the bandgap generator output, the VGA adapted to supply bias current for the power amplifier stage;
- a digital-to-analog converter (DAC) having an input and an output adapted to receive a digital signal at the input and produce an analog signal at the output, the DAC output coupled to a bias input of the VGA; and
- a bias code generator coupled to the DAC input.

16. The cable modem tuner according to claim 15 wherein the bias code generator comprises information stored in memory.

17. The cable modem tuner according to claim 16 wherein the PGA bias code generator comprises a binary code table, wherein the range of binary codes are adapted to adjust the VGA gain by about +/−25% of the power amplifier stage bias current.

18. The cable modem tuner according to claim 15 wherein the PGA bias current-setting circuit further comprises:
- a plurality of resistors coupled together in series between the external bias resistor and the bandgap generator;
- a plurality of switches, each switch coupled in parallel with an associated resistor; and
- the bias code generator having a plurality of outputs comprising a bias code, each switch being coupled to and controlled by an output of the bias code generator, wherein altering the bias code applied to the switches alters the bias current-setting circuit nominal bias current.

19. The cable modem tuner according to claim 15 wherein the PGA power amplifier stage comprises a Class A amplifier.

* * * * *